US012730154B2

(12) United States Patent
Subbotin et al.

(10) Patent No.: US 12,730,154 B2
(45) Date of Patent: Sep. 8, 2026

(54) METHOD AND SYSTEM FOR ESTIMATION OF OPEN CIRCUIT VOLTAGE OF A BATTERY CELL

(71) Applicant: Robert Bosch GmbH, Stuttgart (DE)

(72) Inventors: Maksim Subbotin, San Carlos, CA (US); Farshad Ramezan Pour Safaei, Los Gatos, CA (US); Anantharaman Subbaraman, Mountain View, CA (US); Nikhil Ravi, Redwood City, CA (US); Gerd Simon Schmidt, Palo Alto, CA (US); Reinhardt Klein, Mountain View, CA (US); Yumi Kondo, San Jose, CA (US); Yongfang Cheng, Mountain View, CA (US); Jake Christensen, Elk Grove, CA (US)

(73) Assignee: Robert Bosch GmbH (DE)

( * ) Notice: Subject to any disclaimer, the term of this patent is extended or adjusted under 35 U.S.C. 154(b) by 644 days.

(21) Appl. No.: 16/702,657

(22) Filed: Dec. 4, 2019

(65) Prior Publication Data

US 2021/0173012 A1 Jun. 10, 2021

(51) Int. Cl.
*G01R 31/367* (2019.01)
*G01R 31/382* (2019.01)
(Continued)

(52) U.S. Cl.
CPC ......... *G01R 31/367* (2019.01); *G01R 31/382* (2019.01); *G01R 31/3842* (2019.01); *G01R 31/388* (2019.01)

(58) Field of Classification Search
CPC .......... G06N 3/02; G06N 3/088; G06N 3/126; G06N 20/00; G05B 23/0283;
(Continued)

(56) References Cited

U.S. PATENT DOCUMENTS 5,608,273 A * 3/1997 Bartlett .................. H02J 9/061 307/64
7,583,059 B2 * 9/2009 Cho ........................ B60L 58/12 320/132

(Continued)

FOREIGN PATENT DOCUMENTS

| | | | |
|---|---|---|---|
| DE | 102007029956 | A1 | 1/2009 |
| EP | 2989675 | B1 | 4/2017 |
| WO | 2014130519 | A1 | 8/2014 |

OTHER PUBLICATIONS

Hockenmaier, Machine Learning—Decision Tree, 2015.*

*Primary Examiner* — Lina Cordero
*Assistant Examiner* — Lynda Dinh
(74) *Attorney, Agent, or Firm* — Dickinson Wright PLLC

(57) ABSTRACT

A battery management system includes a memory, a current sensor that measures a current flow through a battery to a load, a voltage sensor that measures a voltage level between a first terminal and a second terminal of the battery that are each connected to the load, and the memory, a temperature sensor that measures a temperature level of the battery; and a controller configured to be operatively connected to the current sensor, temperature sensor, and voltage sensor. The controller is configured to receive a measurement of a first current level and a first voltage level and utilize a corrected capacity and corrected open circuit voltage estimate to output an estimated open circuit voltage of the battery as compared to an estimated capacity.

15 Claims, 8 Drawing Sheets

(51) Int. Cl.
*G01R 31/3842* (2019.01)
*G01R 31/388* (2019.01)

(58) Field of Classification Search
CPC .............. G01R 31/367; G01R 31/3842; G01R 31/392; G01R 31/3648; G01R 31/36; G01R 31/382; G01R 31/374; G01R 31/387; G01R 35/005; G01R 31/388
See application file for complete search history.

(56) References Cited

U.S. PATENT DOCUMENTS 8,188,715 B2 5/2012 Christensen et al.
9,130,248 B2 * 9/2015 Laskowsky ............. B60L 58/16
9,153,991 B2 10/2015 Chaturvedi et al.
9,157,966 B2 * 10/2015 Papana ................ G01R 31/389
9,685,807 B2 6/2017 Nakao et al.
10,224,579 B2 3/2019 Christensen et al.
2007/0005276 A1 * 1/2007 Cho ..................... G01R 31/367 702/60
2008/0234956 A1 * 9/2008 Mizuno ................ G01R 31/367 702/63
2013/0110428 A1 * 5/2013 Sun .................... G01R 31/3842 702/63
2013/0311115 A1 11/2013 Chaturvedi et al.
2015/0066407 A1 * 3/2015 Joe ....................... G01R 31/392 702/63
2016/0054390 A1 * 2/2016 Lin ...................... G01R 31/367 702/63
2017/0338666 A1 11/2017 Christensen et al.
2017/0363690 A1 * 12/2017 Kawamura .......... G01R 31/382
2018/0143259 A1 * 5/2018 Kim ..................... G01R 31/392
2019/0157891 A1 * 5/2019 Chemali ........... H02J 7/007192
2020/0164763 A1 * 5/2020 Holme .................... B60L 58/21
2020/0393514 A1 * 12/2020 Klintberg ........... G01R 31/3832
2021/0080506 A1 * 3/2021 Wampler .............. H02J 7/0069
2022/0365139 A1 * 11/2022 Altaf ......................... B60L 3/12

* cited by examiner

METHOD AND SYSTEM FOR ESTIMATION OF OPEN CIRCUIT VOLTAGE OF A BATTERY CELL

TECHNICAL FIELD

The present disclosure relates to battery cell technology.

BACKGROUND

Open Circuit Voltage (OCV) versus capacity (or SOC) curve of a Lithium-ion cell is a characteristic that may define performance of the battery. This characteristic may be measured at the beginning of cell's life after its manufacturing or during development process (e.g., after formation) and is used by a Battery Management System (BMS) to manage current flow through the cell or provide diagnostic information about the cell to a user or higher-level components of the system utilizing the battery. OCV curve may be normally kept fixed by the BMS for the entire lifetime of the cell even though it may change significantly due to battery aging and these changes influence the BMS performance. In more advanced BMS the curve may be scaled by a remaining cell's capacity with respect to beginning of life (BOL) capacity while its characteristic features remain unchanged.

SUMMARY

According to one embodiment, a method of estimating an open circuit voltage capacity of a battery includes collecting measurements of current, voltage and temperature of the battery until a recorded history interval includes at least one charge stage, one discharge stage, and one rest point to determine a voltage measurement that can be used as open circuit voltage value, determining a biased capacity and biased open circuit voltage of the battery utilizing a machine learning model and a record of current, voltage, and temperature of the battery during a normal operation, wherein the machine learning model is configured to output a corrected capacity and open circuit voltage estimates, and mitigating and correcting any biases associated with time dependent current, voltage, and temperature measurements using an estimation method which estimates bias values and subtract them from the original measurements, and utilizing a batch algorithm with the corrected capacity and corrected open circuit voltage estimates as inputs to output an estimated open circuit voltage of the battery as a function an estimated capacity aligned with physical properties of the battery.

According to a second embodiment, a battery management system includes a memory, a current sensor that measures a current flow through a battery to a load, a voltage sensor that measures a voltage level between a first terminal and a second terminal of the battery that are each connected to the load, and the memory, a temperature sensor that measures a temperature level of the battery, and a controller configured to be operatively connected to the current sensor, temperature sensor, and voltage sensor. The controller is configured to receive a measurement of a first current level flowing through the battery to the load at a first time from the current sensor, receive a measurement of a first voltage level between the first terminal and the second terminal of the battery that are each connected to the load at the first time from the voltage sensor, mitigate any bias associated with an open circuit voltage utilizing a bias estimation algorithm and machine learning model, wherein the machine learning model is configured to output a corrected capacity and correct open circuit voltage estimate, and utilize a batch algorithm with the corrected capacity and corrected open circuit voltage estimate to output an estimated open circuit voltage of the battery as compared to an estimated capacity.

According to a third embodiment, a battery management system includes a memory, a current sensor that measures a current flow through a battery to a load, a voltage sensor that measures a voltage level between a first terminal and a second terminal of the battery that are each connected to the load, and the memory, a temperature sensor that measures a temperature level of the battery; and a controller configured to be operatively connected to the current sensor, temperature sensor, and voltage sensor. The controller is configured to receive a measurement of a first current level flowing through the battery to the load at a first time from the current sensor, receive a measurement of a first voltage level between the first terminal and the second terminal of the battery that are each connected to the load at the first time from the voltage sensor, mitigate any bias associated with the open circuit voltage utilizing a machine learning model, wherein the machine learning model is configured to output a corrected capacity and correct open circuit voltage estimates, and utilize the corrected capacity and corrected open circuit voltage estimate to output an estimated open circuit voltage of the battery as compared to an estimated capacity.

BRIEF DESCRIPTION OF TIE DRAWINGS

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Open Circuit Voltage (OCV) versus capacity curve of a lithium ion (Li-Ion) cell may be a very important characteristic that provides information about remaining capacity of the cell, its age, and composition of remaining active materials within the cell. The knowledge of the OCV curve may allow Battery Management System (BMS) to perform accurately its tasks, such as providing information about remaining battery capacity, power limit estimates, and managing fast charging process while controlling a cell's rate of degradation.

The accurate real-time estimate of battery specified state of charge (SOC) may be determined during dynamic operating using updated information about the OCV-SOC relationship of the cell through various characterization tests or an estimation algorithm. The state of health (SOH) estimation may improve model quality and lead to improved voltage prediction, improved SOC estimation accuracy, and better fast charging algorithms.

While OCV versus capacity curve for a given cell can be characterized in a lab, it may be very difficult to construct during electric vehicle, smart phone, or power tool operation because it may require either a very slow charge or discharge cycle, long rests at specified state of charge (SOC). Thus, this type of characterization may be an impractical for real-life application.

Proposed hybrid algorithm may provide accurate OCV versus capacity curve estimates based on measurements available during operation of lithium ion cells, such as a combination of use cycles with charges and rests of various duration and hence allow update of the OCV curve in real-life application.

Figure 1:
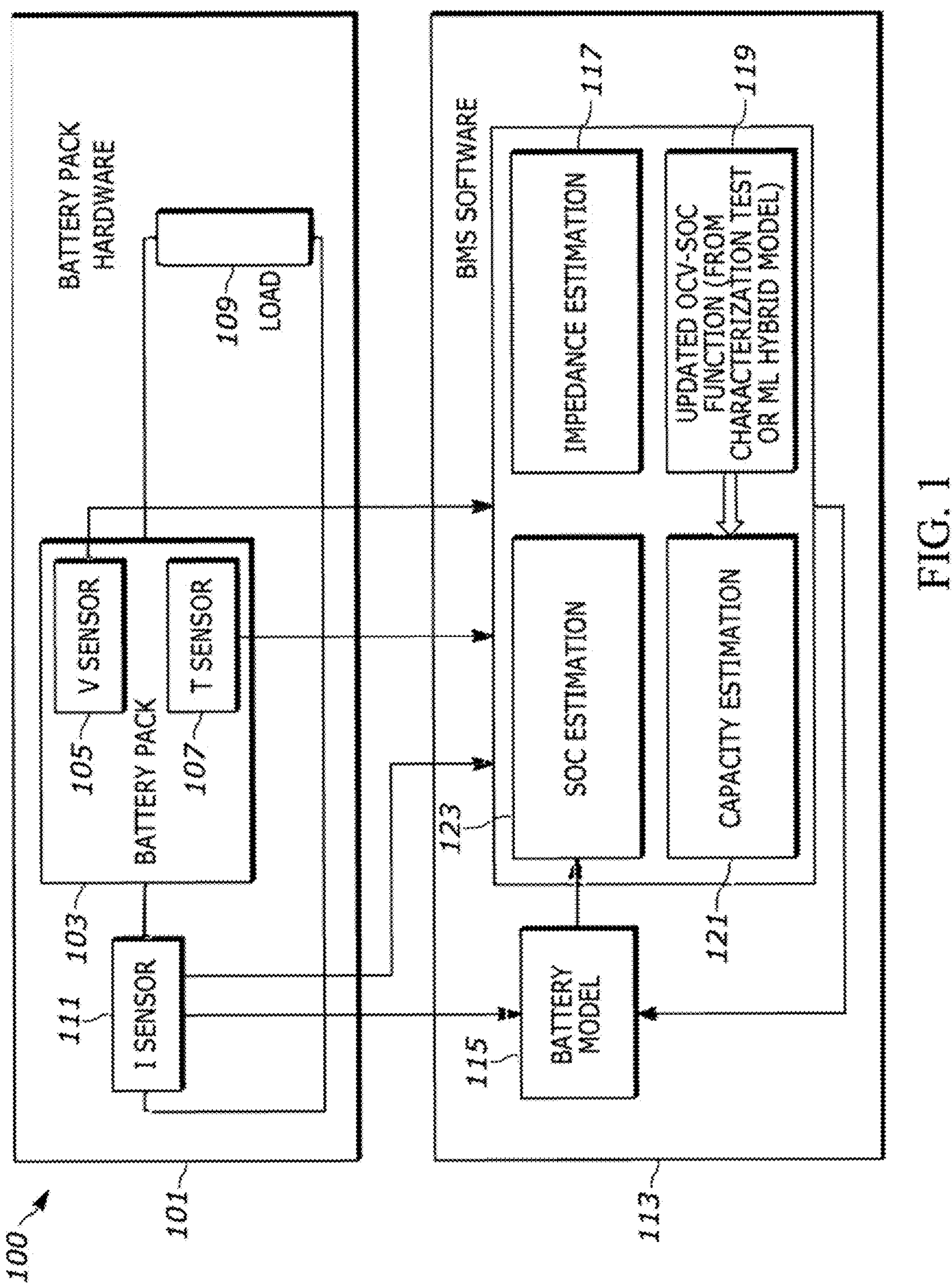
FIG. 1 is an example block diagram of a system.

FIG. 1 is an example block diagram of a system. The battery system 100 may include battery pack hardware 101 and BMS controller 113. The BMS controller 113 may include algorithms related to a battery model 115, SOH (state of health) may utilize an impedance estimator 117, updated OCV-SOC estimator 119, capacity estimator 121, and SOC estimator 123.

The battery system 100 may monitor the OCV and optionally SoC and SoH of a battery connected to a load. The battery system 100 includes a battery pack 103 that provides electrical power to a load 109, a battery management system (BMS) controller 113, which is also referred to as the "controller" 113 herein, and a user display device. While FIG. 1 depicts the battery pack 103 and the battery management system controller 113 as separate elements, in some embodiments the BMS is physically integrated into the battery pack while in other embodiments a BMS is connected to one or more battery packs via a digital communication channel such as a controller area network (CAN) bus, universal serial bus, Ethernet, or any other suitable digital communication channel.

The battery pack hardware 101 may include various components, including a battery pack 103, voltage sensor 105, temperature sensor 107, load 109, and current sensor 111. The battery pack 103 may include electrical terminals as well. The terminals may be connected to battery cells and the battery pack 103 may be connected to a load 109 via the terminals and to enable the battery pack 101 to provide electrical power to the load 109. While FIG. 1 depicts a load 109 that receives electrical power from the battery pack 103 in the battery pack hardware 101, those of skill in the art will also recognize that in some configurations the load 109 is replaced with an electrical power source that provides electrical power to the battery pack 103 to charge the battery cells.

In the battery pack 103, the voltage sensor 105 measures a voltage potential of all of the battery cells, which is depicted with a connection of the voltage sensor 105 to the terminals 8B of the battery pack 103 in FIG. 1. If the battery pack 103 is disconnected from any load and allowed to return to a quiescent, rest state then the voltage sensor 105 can measure the OCV of the battery cells directly. However, during operation of the battery pack 103 to supply electrical current to the load 109, the voltage sensor 105 does not measure the OCV of the battery cells. The voltage sensor 105 may, however, produce voltage measurements that the BMS controller 113 uses in conjunction with other sensor data to generate estimates of the OCV for the battery cells.

The current sensor 111 may measure a flow of electrical current through all of the battery cells of the battery pack 103. The current sensor 111 may be an ammeter that is connected in series with the battery cells, but those of skill in the art will recognize that a shunt resistor, current clamp ammeter, or any other suitable indirect current sensing device is also suitable for use with the battery pack 103. The temperature sensor 107 may be a thermocouple, thermistor, or any other suitable temperature probe that may be affixed to the battery cells to generate measurements of the temperature of the battery cells during operation. In some embodiments the temperature sensor 107 further includes multiple temperature sensing elements that measure the temperatures of different battery cells within a larger array of battery cells in larger battery pack configurations where the battery cells may not have uniform temperatures.

The BMS controller 113 includes at least one digital logic device and at least one memory device. The BMS controller 113 is operatively connected to the battery pack 103 and receives sensor data from the voltage sensor 116, the current sensor 120, and the temperature sensor 107. In the battery system 100, the BMS controller 113 is implemented using at least one microprocessor, microcontroller, field programmable gate array (FPGA), digital signal processor (DSP), application specific integrated circuit (ASIC), or other suitable digital logic devices. The BMS controller 113 optionally includes analog to digital converters (ADCs) in embodiments where one or more of the sensors generate analog sensing signals to enable the BMS controller 113 to process digital representations of the analog sensor signals, although in other embodiments the sensors include ADC circuits that produce digital output data directly. The memory in the BMS controller 113 may include both a volatile data storage device such as a static or dynamic random access memory (RAM) and a non-volatile memory such as NOR and NAND flash or a magnetic disc that stores long-term data such as system software/firmware stored program instructions and parameters for a battery model and other battery characteristics that are described below.

The BMS controller 113 executes stored program instructions in the memory to implement a battery model 115 and state of charge (SOC) estimator 123. The battery model 115 includes stored parameters for an equivalent circuit or electrochemical model that estimates the internal state of the battery cells. The state and parameter estimation logic may be used with the battery model 115 and input data from the voltage sensor 105, current sensor 111, and the temperature sensor 107 to generate estimates for the OCV with the OCV estimator 119, the SOC with the SOC estimator 123, and the impedance estimator 117, and the capacity estimator 121. SOH parameters may include capacity, impedance, volume fractions of active materials and cyclable Lithium, diffusion coefficients, porosity, solid electrolyte interface thickness, or any other properties that can suitably describe state of health of the cell. In another embodiment, the system may also include vehicle range or device remaining runtime estimator that enables a controller to use the estimated SoC and SoH characteristics of the battery cells in the battery pack 103 in conjunction with the past, present, and predicted future power consumption characteristics of the load 140 to generate an estimate of the remaining useful capacity of the battery to drive the load. For example, in an electric vehicle the range estimator may provide an estimate of the remaining driving range of the vehicle before the battery pack 103 needs to be recharged. In a smartphone or other mobile electronic device, a runtime estimator may be used to provide an estimate of how much longer the device may operate until the battery pack 103 needs to be recharged. The BMS controller 113 may also be connected to a user display device 180 which is, for example, an LCD display or an audio output device that generates an output based on the estimated OCV, SoC, and SoH of the battery cells or an output corresponding to the estimated remaining vehicle range or device runtime.

The capacity estimator 121 may estimate the parameter θ using one or more of a Least squares method, Extended Kalman Filter, Moving Horizon Estimator or Recursive Least Square (RLS) method. The Recursive Least Square algorithm (RLS) algorithm accesses a buffer of previously stored estimate data in the memory to estimate the capacity based on the previous estimate available, two or more SoC value estimates over time, and accumulated charge. The evolution of the RLS algorithm based parameter estimate with measurements available after each sampling duration is as follows, as is known to those skilled in the art $$P_k = \frac{1}{\alpha_{\{k-1\}}}\left(P_{\{k-1\}} - \frac{P_{\{k-1\}}^2 x_k^2}{\alpha_{\{k-1\}} + x_{\{k\}}^2 P_{\{k-1\}}}\right)$$

$$\theta_{\{k\}} = \theta_{\{k-1\}} + \frac{P_{\{k-1\}} x_k (y_k - \theta_{\{k-1\}} x_k)}{\alpha_{\{k-1\}} + x_k^2 P_{\{k-1\}}}$$

where α∈[0,1] is the forgetting factor and P_0 is the initial value of the uncertainty matrix. The controller 113 may execute stored program instructions to implement the RLS algorithm above or another variation of an SoH estimation process. The process ensures that the controller 113 may generates the OCV events at times when the charge excitation level of the battery is sufficiently low to enable the OCV-SOC estimator 119 to produce accurate OCV estimates. Since both the OCV-SoC and SoH estimation processes rely upon accurate OCV-SOC inputs, the process enables accurate estimations of OCV-SoC and SoH while the battery pack 103 remains connected to the load 109 during dynamic operation. Because the controller can provide the capacity estimate the most recent information about the OCV_SOC relationship of the cell, one can significantly improve the accuracy of the SOH estimation algorithm.

In contrast, a real-time application cannot allow interruption of the normal operation of the battery operated device in order to measure an updated OCV-SOC relationship. Thus, machine learning based approach (e.g., Subbotin, Estimation of Li-Ion Cell OCV with Hybrid ML-Physics Method, 2018) can provide an accurate OCV-SOC of the cell in real-time and feed that information to the SOH estimation algorithm. Such a hybrid modeling approach can significantly improve the capacity estimation of the cell utilized by the capacity estimator 121. The machine learning algorithm may be based on a neural network and may be trained by using an electrochemical model of a cell. Thus, the system may contain a set of information about internal states of the battery and provide an accurate estimate of the OCV-SOC function in real-time.

The controller may optionally use the measured changes ΔSoC and measurements of the current flow through the battery over time during operation of the battery pack 104 to generate estimates of the SoH of the battery cells while the battery pack 103 drives the load 109. To estimate the SoH, the controller 113 may use the capacity estimator 121 to combine multiple measurements of changes in the SoC over time with a process that is referred to as "Coulomb counting" referring to the total amount of charge that the battery pack 103 delivers to the load 109 over time to estimate the total capacity of the battery cells at different times. The Coulomb counting process measures accumulated charge based on the following equation:

$$\text{Accumulated Charge} = \int_{t_1}^{t_2} I(\tau)\,d\tau.$$

The controller may identify the accumulated charge by summing the current level measurement values that are received from the current sensor 111 between the times t1 to t2 to identify the accumulated charge as a value in units of Coulombs or an equivalent charge unit. As is well known in the art, the current measurement values, which are often expressed using Amps as a unit, refer to the rate at which charge moves in a circuit. The controller 113 sums the rate measurements over time to implement a numeric integration process that identifies the total accumulated charge over the time span from t1 to t2.

The SoH is related to ΔSoC and the accumulated charge based on the following equation:

$$\Delta SoC = SoC(t_2) - SoC(t_1) = \frac{1}{SoH} * \int_{t_1}^{t_2} I(\tau)\,d\tau$$

The equation above solved for SoH provides:

$$SoH = \frac{1}{\Delta SoC} * \int_{t_1}^{t_2} I(\tau)\,d\tau$$

The above equation can be rewritten in an input output format with the output y representing the accumulated charge and the input x represents the change in SoC. The parameter θ represents the SoH of the battery.

Accumulated Charge=SoH*(ΔSoC)

$y=\theta x.$

The SoH estimation process generally requires multiple sets of ΔSoC and accumulated charge data to produce accurate estimates of the battery SoH. The capacity estimator 168 in the controller 113 estimates the parameter θ using one or more of a Least squares method, Extended Kalman Filter, Moving Horizon Estimator or Recursive Least Square (RLS) method. One embodiment using RLS is explained below for illustrative purposes. The Recursive Least Square algorithm (RLS) algorithm accesses a buffer of previously stored estimate data in the memory to estimate the capacity based on the previous estimate available, two or more SoC value estimates over time, and accumulated charge. The evolution of the RLS algorithm based parameter estimate with measurements available after each sampling duration is as follows, as is known to those skilled in the art $$P_k = \frac{1}{\alpha_{\{k-1\}}}\left(P_{\{k-1\}} - \frac{P_{\{k-1\}}^2 x_k^2}{\alpha_{\{k-1\}} + x_{\{k\}}^2 P_{\{k-1\}}}\right)$$

$$\theta_{\{k\}} = \theta_{\{k-1\}} + \frac{P_{\{k-1\}} x_k (y_k - \theta_{\{k-1\}} x_k)}{\alpha_{\{k-1\}} + x_k^2 P_{\{k-1\}}}$$

Figure 2A:
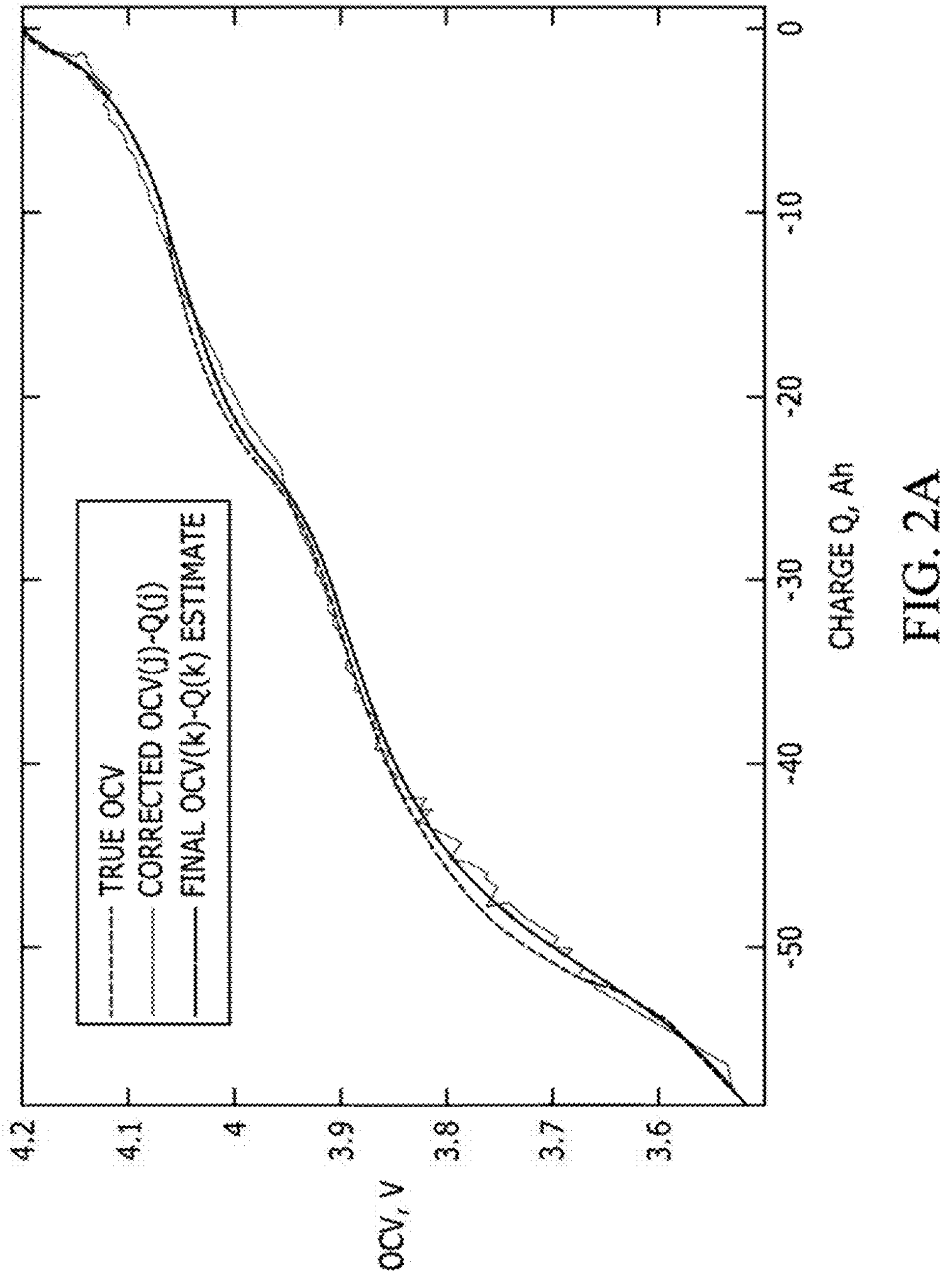
FIG. 2A illustrates a final OCV(k)-Q(k) curve estimate generated by the Batch algorithm.
Figure 2B:
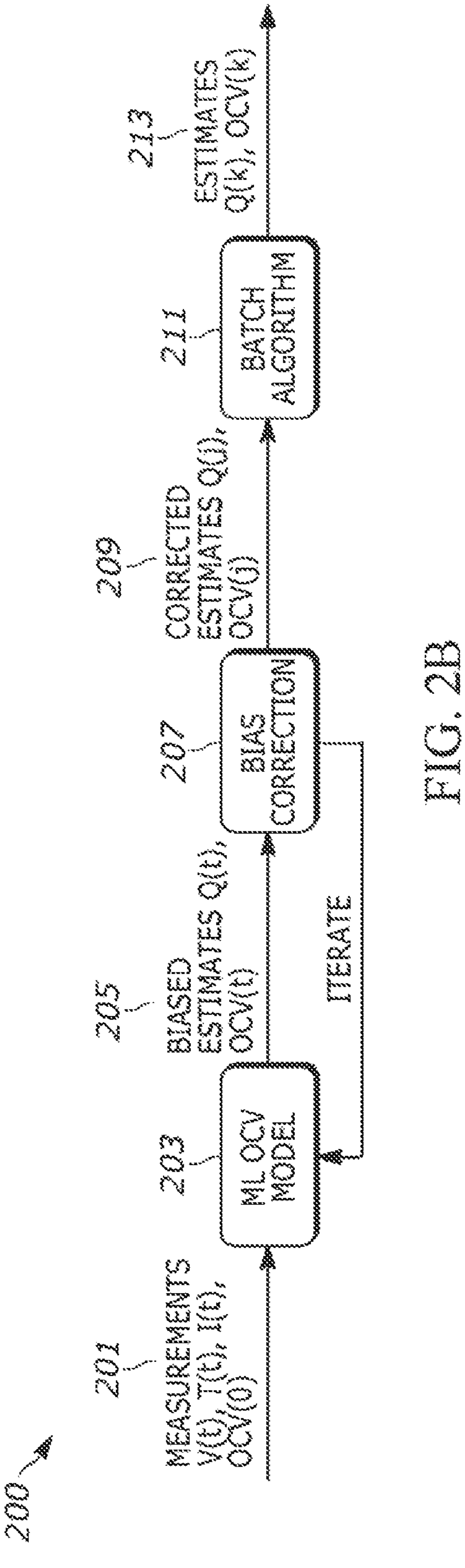
FIG. 2B illustrates an example of a block diagram of a graphical representation of a hybrid OCV-capacity estimation algorithm.

FIG. 2B is an example of a block diagram of a graphical representation of a hybrid OCV-capacity estimation algorithm. The algorithm is hybrid in nature because it may combine Machine Learning (ML) OCV data driven model with physics-based model of a cell contained in a Batch algorithm 211.

As shown in FIG. 2B, an overview 200 of the ML OCV model 203 may map available time dependent cell measurements into time dependent OCV(t) estimate 205. Such measurements 201 may include an instantaneous measurement of voltage (e.g., V(t)), temperature (e.g., T(t)), current (e.g., I(t)), and voltage measurements after a long rest (e.g., OCV(O)), to temporal estimates of OCV (e.g., OCV(t)) 205 versus temporal estimates of capacity (e.g., Q(t). Such measurements are input 201 that are fed into the ML OCV model 203. The measurements may be made with various sensors. The ML model may include various architectures such as ANN, RNN, CNN, LSTM, fuzzy network, decision tree, SVM or any other suitable architecture.

A Bias correction algorithm 207 may attempt to eliminate current and voltage measurement biases from the measurements. In addition to that, the Bias correction algorithm 207 may convert temporal estimates of OCV(t) 205 versus capacity Q(t) estimates to an OCV(j)-Q(j) pairs of estimates 209, thus removing time dependency, where j is an index of the corresponding OCV-Q pair. The process of generating OCV(t) estimates and bias correction may be iterated serval times to improve accuracy. Thus, the process may be generated on multiple occasions. The bias correction 107 may be performed by a Kalman filter, Particle filter, polynomial filter, and other similar filters.

Because current measurement biases and noises may introduce additional errors in the OCV(t) estimates generated by the ML Model, correction and filtering may be helpful. The Bias correction algorithm 207 may process OCV(t) versus Q(t) curves to generate OCV(j) versus Q(j) pairs in order to eliminate biases from current measurements and prepare proper inputs for the Batch algorithm 211. The Bias correction algorithm 207 may solve an optimization problem of finding constant current biases during continuous periods of charge or discharge, while minimizing the sum of Euclidian distances between neighboring points along an OCV-Q trajectory. Graphical representation of the algorithm is shown on FIG. 5.

A Batch Algorithm 211 may process rough OCV capacity estimates to a final OCV (e.g., OCV(k)) versus capacity (e.g., Q(k)) estimate, as shown as output 213. The Batch algorithm 211 may estimate the OCV(k) and Q(k) by aligning them with physics-based model of a cell comprised of active materials of a lithium-insertion anode and a lithium-insertion cathode. The Batch Algorithm 211 may receive a set of OCV(j)-Q(j) pairs and convert them to a final OCV(k)-Q(k) curve estimate, which may impose physical constraints. The OCV capacity curve of a Li-Ion cell may be a combination of open circuit potentials (OCP) of active materials that include anode and cathode of the cell. The combination may be determined by active volume fractions of individual materials and an amount of cyclable Lithium available for reaction. The Batch Algorithm 211 may include an optimization routine that searches for potential combination of OCPs that may provide the best fit with the input OCV(j)-Q(j) set while using volume fractions and total cyclable Lithium as design variables and satisfying physical constraints on them. FIG. 2A may show a final OCV(k)-Q(k) curve estimate generated by the Batch algorithm. The Batch Algorithm processing may align OCV(k)-(Q(k) curve estimate even closer to the true OCV curve by imposing physical constrains as detailed. The Batch Algorithm may be one such as that described in U.S. Patent Publication No. 2019/0036356, entitled "Method and System for Estimating Battery Open Cell Voltage, State of Charge, and State of Health During Operation of the Battery," which is hereby incorporated by reference in its entirety.

The ML model may utilize a synthetic approach for generating ML model training data. The physics-based model of the Li-ion cell may be fitted into a limited set of experimental data and then used to generate ML model training data for a full spectrum of use cases, environmental conditions, and cell ages. The system may use a reduced-order electrochemical Li-Ion cell model (ROM) and parameterized using experimental data from an automotive cell. Utilization of a model for data generation allows for fast collection of a representative set of data. The ROM may be driven by current trajectories that are combined combinations of characteristic drive cycles with fast charges and rests of random durations in random order and starting from random initial conditions. To model various aging between cells due to manufacturing and different use cases, parameters of the ROM may be permuted within ranges expected during the cell's life. In addition to accelerating data collection, the model may provide estimates of OCV-capacity curves to be used in supervised ML model training.

Figure 3:
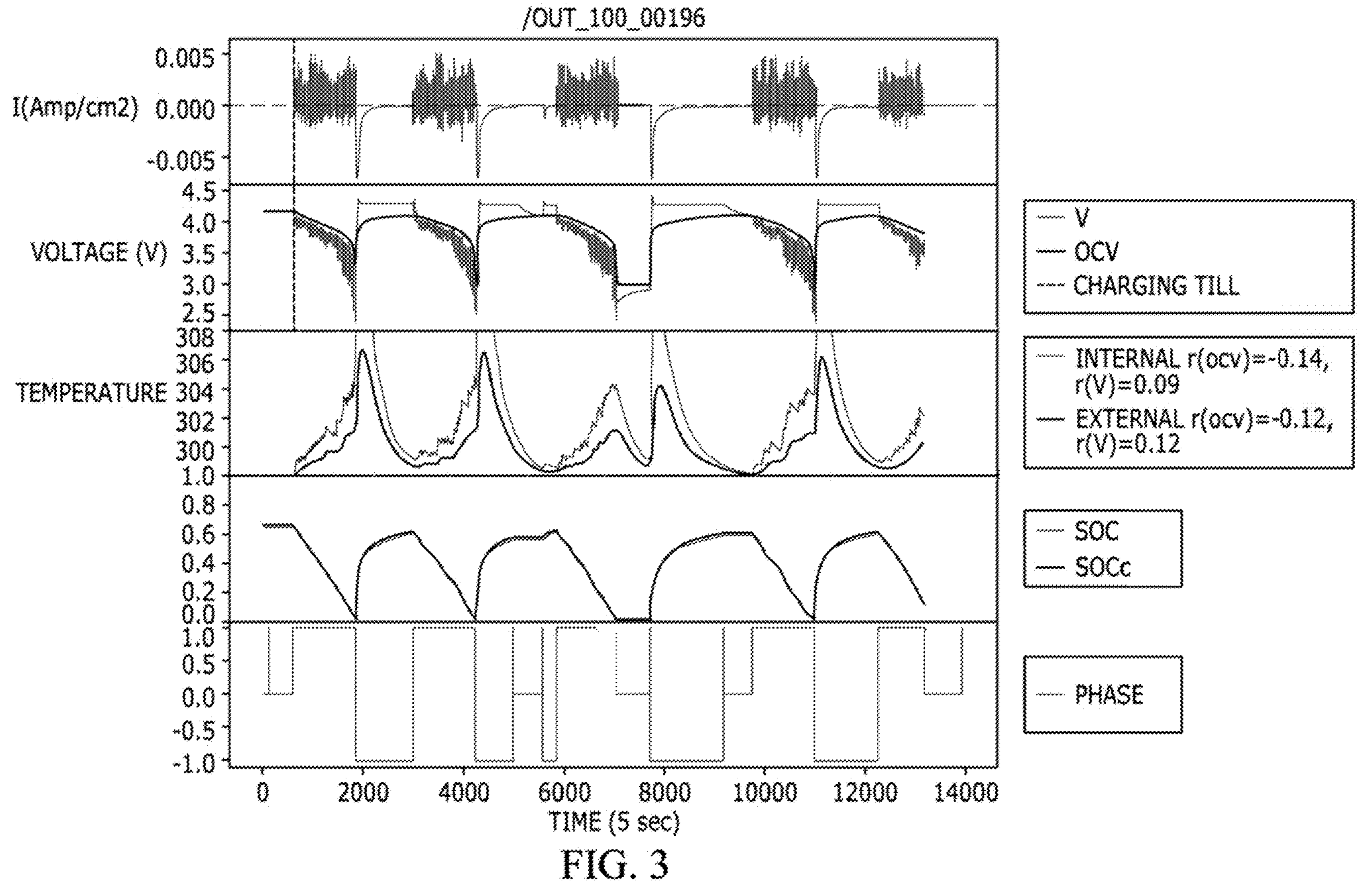
FIG. 3 is an example of a simulation result of a ML model training.

FIG. 3 is an example of a simulation result of a ML model training. An important task in development of accurate ML modeling is collection of data utilized for the model training and testing. However, experimental cell data may be expensive because it may require significant amount of resources, time (months), and testing equipment to collect a data set that can represent expected real-life variability of use cases and environmental conditions. A synthetic approach for generating ML model training data may have advantages. In such an approach, a detailed physics-based model of the Li-Ion cell may be fitted into a limited set of experimental data and then used to generate ML model training data for a full spectrum of use cases, environmental condition, and cell ages.

In such a task, a reduced-order electrochemical Li-Ion cell model (ROM) may be parameterized by using experimental data from an automotive cell. Utilization of a model for data generation may allow for fast collection of a representative set of data. The ROM may be driven by current trajectories that include combinations of characteristic drive cycles with fast changes and rests of random durations in random order and starting from random initial conditions. To model the aging behavior of a cell and variability between cells due to manufacturing and different use cases, parameters of the ROM may be permuted within ranges expected during cell's life. In addition to accelerating data collection, the model may provide estimates of OCV-capacity curves to be used in supervised ML model training.

As shown in FIG. 3, the ROM simulation results show voltage, temperature, SOC response to current trajectories. Measurements may be available as inputs for ML model that are engineered into input features to provide the model with more descriptive data. Past measurements values of voltage, current, and temperature may be provided to capture dependency of current state of the cell and corresponding OCV of the past charge/discharge trajectory. Future measurement values with respect to considered time, t, may be used in order to facilitate filtering of the measurements. Future samples may be provided in this formulation because a complete hybrid algorithm provides OCV-capacity estimates after sufficient amount of data is collected and processed and hence an ML model estimation does not have to be casual.

Figure 4:
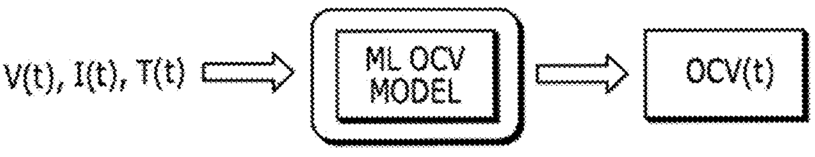
FIG. 4 is an example block diagram of a graphical representation of a developed Machine Learning model estimating OCV(t) trajectory.

FIG. 4 is an example block diagram of a graphical representation of a machine learning model providing OCV(t) estimates and using current, voltage, and temperature measurements as inputs. The current measurement biases and noises may introduce additional errors in OCV(t) estimates generated by the ML Model. In addition, the Batch algorithm takes OCV versus capacity Q pairs and inputs, not time dependent OCV(t) and Q(t) curves in order to generate physics-based OCV versus capacity curve. ML OCV model may map available temporary cell measurements. The ML OCV model may use instantaneous measurements of voltage, temperature and current. As such, measurements may include an instantaneous measurement of voltage (e.g., V(t)), temperature (e.g., T(t)), current (e.g., I(t)), and voltage measurements after a long rest (e.g., OCV(O)). Such measurements are input 101 that are fed into the ML OCV model and utilized to output the OCV(t). A Batch Algorithm may process rough OCV capacity estimates to a final OCV measurement (e.g., OCV(k)) and capacity measurement (e.g., Q(k). The Batch algorithm may estimate the OCV(k) and Q(k) by aligning them with physics-based model of a cell comprised of active materials of a lithium-insertion anode and a lithium-insertion cathode.

Figure 5:
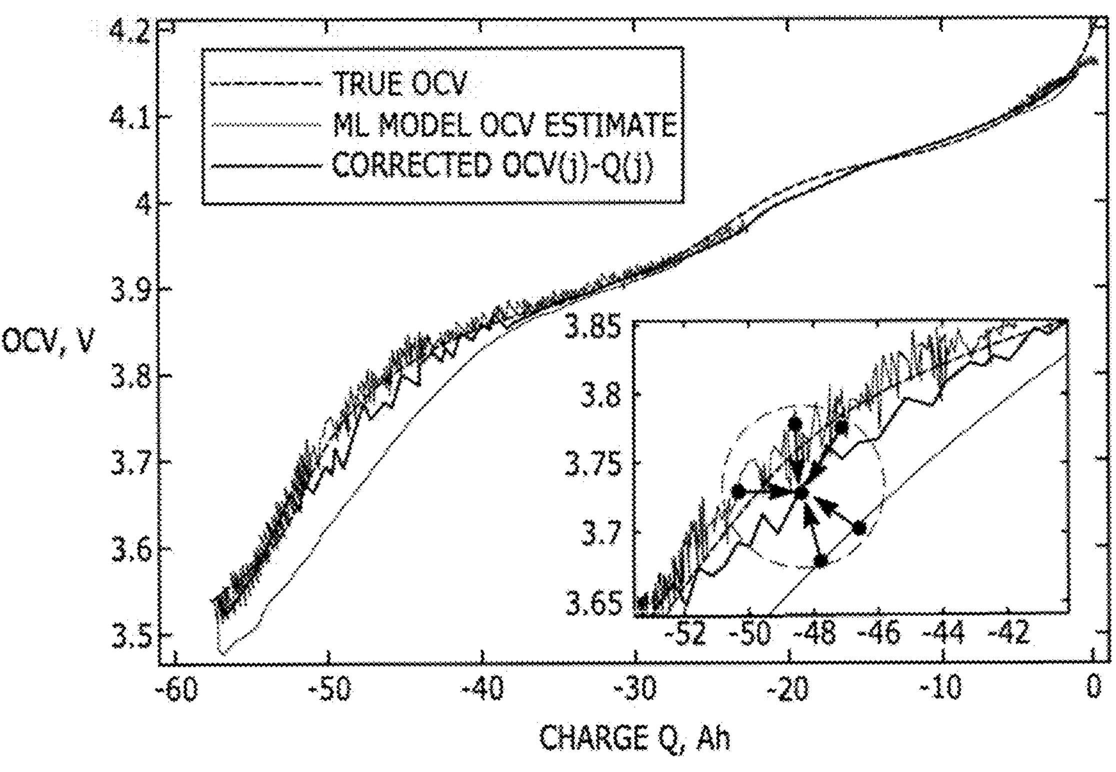
FIG. 5 is an example of a graphical representation of the Bias correction and conversion process.

FIG. 5 is an example of a graphical representation of the Bias correction and conversion process. A first curve on the figure may show a true OCV versus a Q curve for one of the simulated sets of ROM parameters. Another trajectory may show OCV(t) versus Q(t) estimates generated by the ML model as the cell followed charge-discharge trajectories before bias correction. Coulomb counting may be utilized to compute Q(t) and thus be contaminated with current bias. As shown in FIG. 5, cell charges and discharges from the ML model output naturally slides up or down the OCV curve. ML Model in the simulation results shows a closer match with the true OCV during drive cycle than during fast charge, especially at voltages below 3.85V due to biases.

The corrected OCV(j)-Q(j) curve may show the results after bias correction and aggregation of OCV(t) vs Q(t) trajectories into one curve—a set of OCV(j)-Q(j) pairs. The correction and aggregation was able to bring OCV(j)-Q(j) curve closest to the true OCV-Q curve as shown in FIG. 5. The points on the bias correction and aggregation curve of the corrected trajectories may be computed by solving an optimization problem of finding points closet to a set of points on the ML Model OCV estimate curve within balls of certain radius while using current bias estimates as free variables. The insert in FIG. 5 illustrates that process graphically by showing multiple points within a ball from several trajectories along the ML Model OCV estimate aggregated to one OCV(j)-Q(j)-pair point.

Figure 6:
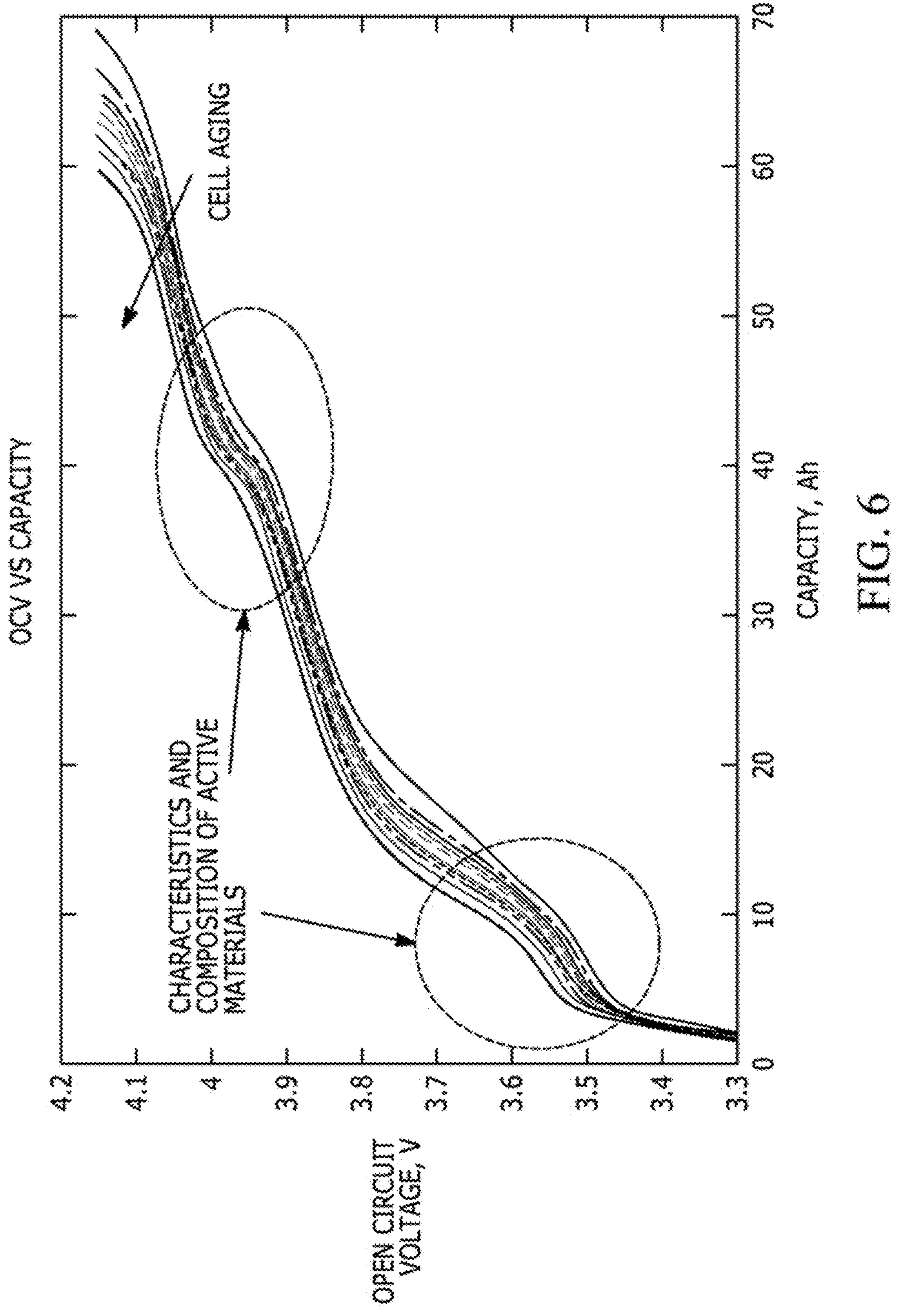
FIG. 6 illustrates an example of the OCV-capacity curves of the aging cell.

FIG. 6 illustrates an example of the OCV-capacity curves of the cell. The evolution of the OCV versus capacity curve of an experimental Li-ion cell is also shown. The OCV-capacity curve is shown as the evolution from the BOL until 900 cycles. Algorithm validation was performed on a set of data generated during experimental testing of an automotive Li-ion cell. The testing procedure included characterization tests performed at the beginning of cell's life (BOL) and every 100 charge-discharge cycles after. Between characterization tests each cell was cycled with a fast charge and a dynamic drive cycle discharge with rests in between. Full charge and discharge of a cell were defined by the limiting voltage range and SOC values. The fast charge was performed using Bosch BMS algorithm which minimizes charging time. Characterization tests allowed accurate measurement of OCV-capacity curves throughout the life of the cell. As shown in FIG. 6, the OCV-capacity curves of the cell evolved from the BOL until 900 cycles. As can be seen from the figure, the cell's capacity was degrading as it aged. OCV-capacity curve features (curves, bends, their shapes and locations) were also evolving as active materials within anode and cathode, and cyclable Lithium were utilized.

Figure 7:
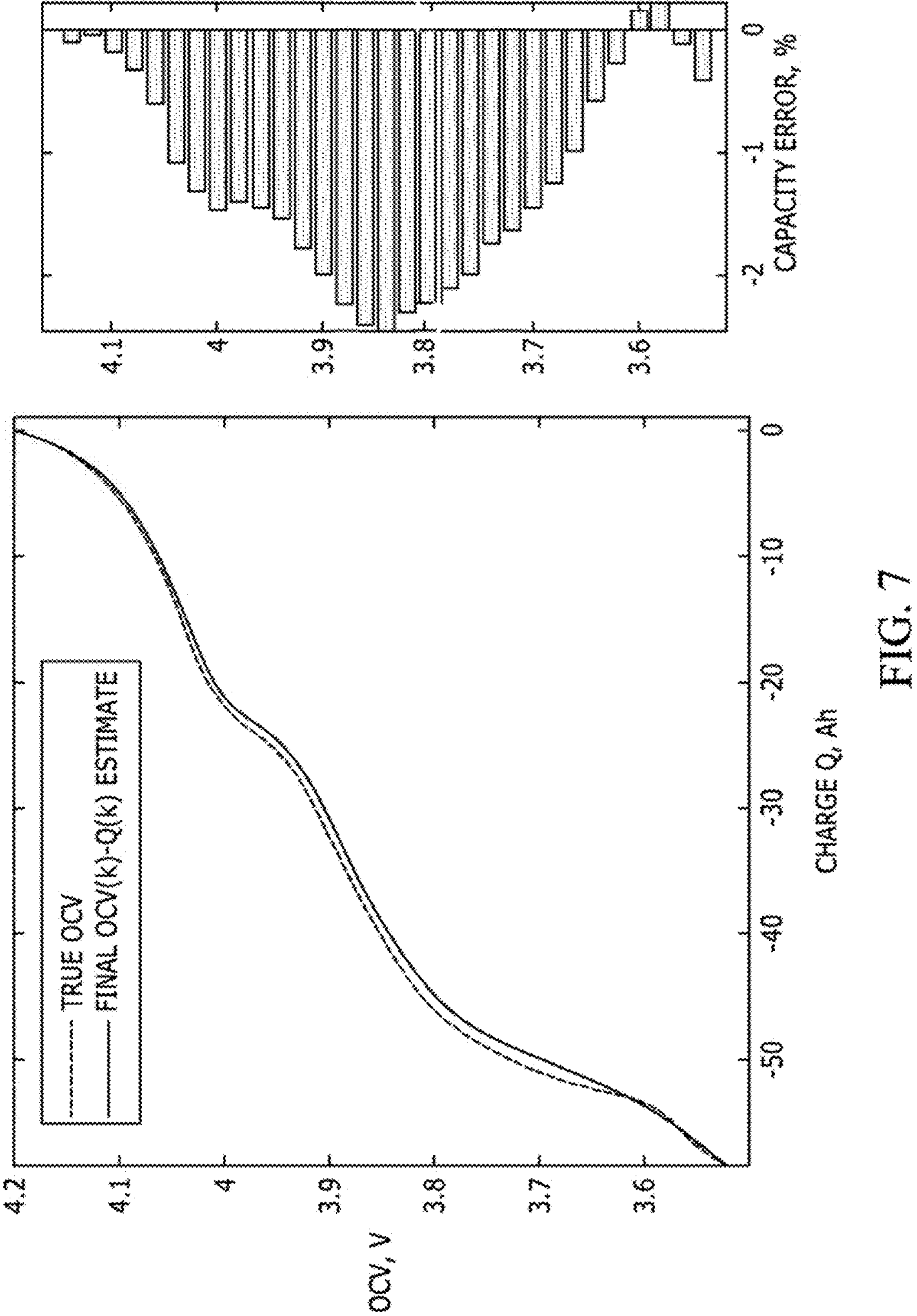
FIG. 7 illustrates an estimation error histogram.

FIG. 7 illustrates an estimation error histogram. The histogram displays the OCV-capacity curve of the cell after 900 cycles. To evaluate performance of the algorithm, a capacity estimation error may be utilized as the metric. FIG. 6 shows a true OCV-capacity curve and its corresponding estimate on the left subplot after 900 cycles. The right subplot shows a bar diagram of capacity estimation errors for various OCVs. As shown in the histogram, a worst case estimation of 2.5% of the normal cell capacity was around 3.85V OCV. In similar diagrams that were generated for validation test every 100 cycles, the highest observed worst case error was 3% at BOL of the cell. Such an evaluation shows that even in demanding test scenario where the cell was aging quickly, the developed algorithm was able to maintain estimation accuracy within 3% for the worst case error through the operating voltage range.

Figure 8:
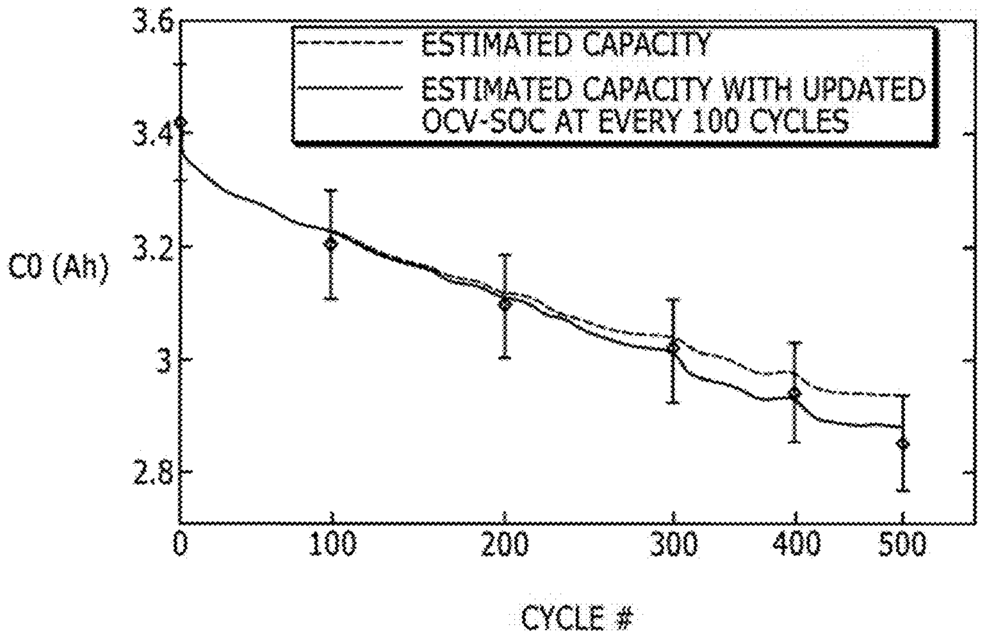
FIG. 8 illustrates a graph of capacity estimation with updated OCV-SOC data.

FIG. 8 illustrates a graph of capacity estimation with updated OCV-SOC data. The capacity estimation illustrates an estimation of 18650 cells over 500 cycles. The true capacity of the cell may be measured every 100 cycles by interrupting normal operation of the battery. The diamond shapes may indicate the measure (true) capacity of the cell along with a 3% error bar. The top line may be the result of the RLS algorithm using the beginning of life OCV-SOC relationship. The bottom line may be the result of RLS algorithm together with the updated OCV-SOC relationship at every 100 cycles. As shown, the bottom line may be closer to the measured capacity as compared to the top line that does not utilize the updated OCV-SOC information. As shown, both algorithms start with the same initial guess for capacity and have similar (or same) tuning parameters. However, the updated OCV-SOC faction in the SOH-C estimator improves the accuracy with an estimation error of smaller than 2%. In practice, the ML OCV model ca be utilized to estimate the OCV-SOC function more frequently to further increase the accuracy of the SOH estimation.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A method of estimating an open circuit voltage capacity of a battery, comprising:

collecting measurements of current, voltage and temperature of the battery until a recorded history interval includes at least one charge stage, one discharge stage, and one rest point to determine a voltage measurement that is utilized as open circuit voltage value;

utilizing a machine learning model that includes a record of each the current, the voltage, and the temperature of the battery during a normal operation of the battery, determining a biased capacity of the battery and biased open circuit voltage of the battery, wherein the machine learning model is configured to output both a corrected capacity and open circuit voltage estimates, and the machine learning model includes a neural network configured to be trained utilizing an electrochemical model of a cell;

mitigating and correcting any biases associated with time dependent current, time dependent voltage, and time dependent temperature measurements using an estimation method which estimates the biases utilizing a filter and subtracts the biases values from original measurements; and utilizing a batch algorithm with the corrected capacity and the corrected open circuit voltage estimates as inputs to output an estimated open circuit voltage versus capacity estimates of the battery as a function of capacity curve estimates with physical properties of the battery.

2. The method of claim 1, wherein the method further includes utilizing the machine learning model to generate a real-time open circuit voltage estimate as a function of time.

3. The method of claim 1, wherein the time dependent current, the time dependent voltage, and the time dependent temperature of the battery are measured at an instantaneous moment.

4. The method of claim 1, wherein the current, the voltage, and the temperature measurements of the battery are recorded over a period of time.

5. The method of claim 1, wherein the current, the voltage, and the temperature measurements of the battery are recorded with a sampling frequency.

6. The method of claim 1, wherein the method further includes mitigating current measurement biases utilizing a bias estimation algorithm and machine learning model.

7. The method of claim 1, wherein the method further includes mitigating voltage measurement biases utilizing a bias estimation algorithm and machine learning model.

8. The method of claim 1, wherein the estimated open circuit voltage of the battery is known after a period of rest of the battery.

9. The method of claim 1, wherein the normal operation includes a charge regime, a discharge regime, and intermediate rests.

10. A battery management system comprising:

a memory;

a current sensor that measures a current flow through a battery to a load;

a voltage sensor that measures a voltage between a first terminal and a second terminal of the battery that are each connected to the load, and the memory;

a temperature sensor that measures a temperature level of the battery; and a controller configured to be operatively connected to the current sensor, the temperature sensor, and the voltage sensor, wherein the controller is configured to:

receive a measurement of a first current level flowing through the battery to the load at a first time from the current sensor;

receive a measurement of a first voltage level between the first terminal and the second terminal of the battery that are each connected to the load at the first time from the voltage sensor;

mitigate any bias associated with an open circuit voltage utilizing a machine learning model utilizing time dependent measurements and estimating bias values via a filter, wherein the machine learning model is configured to output a corrected capacity and correct open circuit voltage estimates, and the machine learning model includes a neural network that is trained utilizing an electrochemical model of a cell; and utilize a batch algorithm with the corrected capacity and the corrected open circuit voltage estimate to output an estimated open circuit voltage versus capacity estimates of the battery as function of capacity curve estimates with physical properties of the battery.

11. The battery management system of claim 10, wherein the machine learning model is configured to generate a real-time open circuit voltage estimate as a function of time.

12. The battery management system of claim 10, wherein the current, the voltage, and the temperature of the battery are measured at an instantaneous moment.

13. The battery management system of claim 10, wherein the controller is further configured to mitigate current measurement biases utilizing a bias estimation algorithm and machine learning model.

14. The battery management system of claim 10, wherein the controller is further configured to mitigate voltage measurement biases utilizing a bias estimation algorithm and machine learning.

15. The battery management system of claim 10, wherein the estimated open circuit voltage of the battery is known is after a period of rest of the battery.

* * * * *